United States Patent [19]

Jones et al.

[11] Patent Number: 4,879,624
[45] Date of Patent: Nov. 7, 1989

[54] POWER CONTROLLER

[75] Inventors: Gregory D. Jones; William R. Owens, both of Rockford; Clifford G. Thiel, Stillman Valley; Clive M. Danby, Rockford, all of Ill.

[73] Assignee: Sundstrand Corporation, Rockford, Ill.

[21] Appl. No.: 137,582

[22] Filed: Dec. 24, 1987

[51] Int. Cl.<sup>4</sup> ............................................. H02J 3/00
[52] U.S. Cl. ........................ 361/65; 361/66; 361/92; 361/5; 361/6; 307/64; 307/87; 364/483
[58] Field of Search .................. 361/89, 90, 92, 94, 361/95, 62–66, 3, 5–7; 307/64–66, 84–87, 70, 130, 131, 23, 29, 39; 364/487; 363/69, 70, 72

[56] References Cited

U.S. PATENT DOCUMENTS

| | | | |
|---|---|---|---|
| 3,337,742 | 8/1967 | Baehr et al. | 307/64 |
| 3,505,598 | 8/1967 | Merrill | 324/77 |
| 4,075,502 | 2/1978 | Walley, Jr. | 307/64 |
| 4,087,697 | 5/1978 | Johnson | 307/66 |
| 4,096,395 | 6/1978 | Bogel et al. | 307/64 |
| 4,156,280 | 5/1979 | Griess | 364/481 |
| 4,219,858 | 8/1980 | DePuy et al. | 361/93 |
| 4,219,860 | 8/1980 | DePuy | 361/94 |
| 4,231,029 | 10/1980 | Johnston | 346/658 |
| 4,356,553 | 10/1982 | Steinle et al. | 364/483 |
| 4,384,213 | 5/1983 | Bogel | 307/64 |
| 4,405,867 | 9/1983 | Moakler et al. | 307/64 |
| 4,423,458 | 12/1983 | Stich | 361/93 |
| 4,446,498 | 5/1984 | Stich | 361/87 |
| 4,475,047 | 10/1984 | Ebert, Jr. | 307/66 |
| 4,520,275 | 5/1985 | Marusik | 307/64 |
| 4,535,409 | 8/1985 | Jindrick et al. | 364/481 |
| 4,583,004 | 4/1986 | Yearsin | 307/64 |
| 4,605,982 | 8/1986 | Harner et al. | 361/94 |
| 4,625,283 | 11/1986 | Hurley | 364/487 |
| 4,628,397 | 12/1986 | Gareis et al. | 361/98 |
| 4,761,563 | 8/1988 | Ross et al. | 307/87 |

Primary Examiner—Todd E. Deboer
Attorney, Agent, or Firm—Antonelli, Terry & Wands

[57] ABSTRACT

A system is disclosed for sequentially disconnecting multiple phases of a first power source (12) from an electrical load (14) requiring a minimum of interruption and connecting a second power source (28) to the electrical load. A first embodiment of the invention disconnects immediately the phase in which a trip condition requiring disconnection of the first source power is detected and disconnects phases of a first power source (12) in which a trip condition is not detected upon the detection of zero current flow in those phases. In a second embodiment of the invention, each of the phases of the first power source (12) is disconnected immediately from the electrical load (14) upon the detection of a trip condition in any one of the phases requiring disconnection of the first power source. In both embodiments of the invention, the phases of the second backup power source (28) are connected upon the detection of the occurrence of zero voltage points in the respective phases. One of the features present in this system is an inhibiting signal which is created when the second backup power source, not on line, goes bad which prohibits a disconnection of the first power supply from the electrical load.

17 Claims, 4 Drawing Sheets

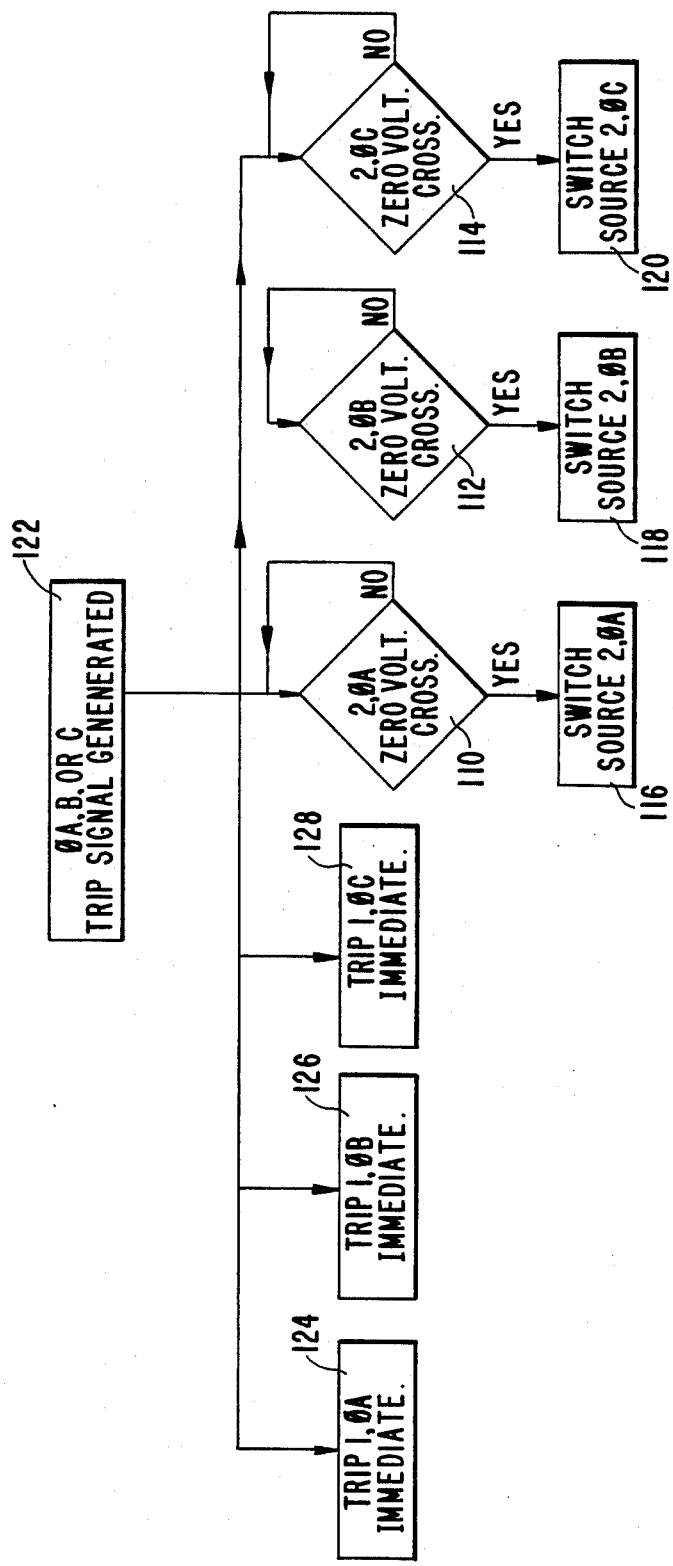

POWER CONTROLLER

CROSS REFERENCE TO RELATED APPLICATIONS

Reference is made to the following applications which contain subject matter related to the present invention and which are incorporated herein by reference in their entirety:

1. $I^2t$ Trip Generator, U.S. patent application Ser. No. 78,366, filed on July 27, 1987, now U.S. Pat. No. 4,782,422.
2. Current Fault Protection System, U.S. patent application Ser. No. 137,583, filed on even date herewith now U.S. Pat. No. 4,812,943.
3. Voltage Fault Detector, U.S. patent application Ser. No. 137,735, filed on even date herewith now U.S. Pat. No. 4,841,934.
4. Phase Controller for Processing Current and Voltage Faults, U.S. patent application Ser. No. 137,575, filed on even date herewith now U.S. Pat. No. 4,811,136.

TECHNICAL FIELD

The present invention relates to power supplies for electrical loads requiring minimal interruption of power.

BACKGROUND ART

In power supplies for airframes, multiphase power supplies are used which have a first multiple phase power source which supplies electrical power to electrical loads, which require a minimum of interruption of power, and a second backup power supply which is connected to the electrical load upon the detection of an electrical fault in one or more of the phases of the first power source. These power supplies do not disconnect the phases of the first power source which do not have a fault at a precise point during the cycle of the AC power provided by the first power source and do not control the connection of the phases of the second power source to the electrical load at a precise point during the cycle of the phases provided by the second power source.

Power supplies are known in which a first operating power supply is backed up with a second power supply which is connected to the electrical load upon the detection of a fault condition in the first power supply. See U.S. Pat. Nos. No. 3,337,742, 4,075,502, 4,087,697, 4,096,395, 4,231,029, 4,384,213, 4,405,867, 4,520,275 and 4,583,004. None of these power supplies disconnects the phases of the first power supply which do not have a fault at a precise point during the cycle of the AC power provided by the first power source and controls the connection of the phases of the second power source to the electrical load at a precise point during the cycle of the AC power provided by the second power source.

It is known that switching losses and stress to a switch may be minimized by switching a switch when the voltage drop across the switch is zero. U.S. Pat. Nos. 4,138,715, 4,196,469 and 4,413,313 disclose that switching losses from a transistor may be minimized by switching the transistor state during the time that the voltage across the transistor is zero.

DISCLOSURE OF INVENTION

The present invention provides a power supply system having a first operating power supply and a second backup power supply which is substituted for the first power supply upon the detection of a voltage fault in any one of the phases of the first power supply to provide minimal interruption of power for a electrical load. In a first embodiment of the invention, points in time of zero current flow between the phases of the first power supply and the electrical load are determined and monitored by a master controller for synchronously disconnecting those phases of the first power source which do not have a fault at the zero current point in response to the detection of a voltage fault in another phase of the first power source. In a second embodiment of the invention, each of the phases of the first power supply are disconnected immediately upon the detection of a fault in any one of the phases of the first power source. In both the first and second embodiments of the invention, upon a fault in the first power source the phases of the second backup power source are respectively connected to the electrical load in response to the detection of a zero voltage in each of the phases of the second power source.

In the first embodiment of the invention, the disconnection of the phases of the first power source which do not have voltage fault at the time when zero current is flowing between these phases and the electrical load minimizes harmful inductive effects which could damage or destroy the electrical switches controlling the flow of current between the phases of the first power source and the electrical load. Furthermore, in both the first and second embodiments of the invention, switching of the phases of the second power source to the electrical load synchronous with the detection of a zero voltage point in these phases minimizes switching losses and stress on the switches.

A power supply of an electrical load requiring minimal interruption of power in accordance with a first embodiment of the invention includes a first power source having at least two phases, each first power source phase having an associated first power source phase switching circuit disposed between the first power source phase and the electrical load, each first power source phase switching circuit having a first conductivity permitting current to flow between the associated first power source phase and the electrical load and a second conductivity blocking current flow between the associated first power source and the electrical load in response to a phase trip signal and a first power source phase controller controlling the conductivity of the associated first power source switching circuit, monitoring the flow of current between the first power source phase and the electrical load for detecting each occurrence when current flow between the first power source phase and the electrical load is zero and generating the phase trip signal in response to detection of a voltage fault in the first power source phase; a second power source having an identical number of phases as the first power source, each second power source phase having an associated second power source switching circuit disposed between a second power source phase and the electrical load, each second power source switching circuit having a first conductivity permitting current to flow between the second power source phase and the electrical load and a second conductivity blocking current flow between the second power source phase and the electrical load, each second power source phase not being connected to the electrical load during operation of the first power source when a trip condition producing the trip signal is not present in at least one of the phases of the first power source by maintaining the second power source switching means in the second conductivity, and a second power source controller controlling the conductivity of the associated second power source phase and monitoring the voltage of the associated phase of the second power source and producing a zero voltage signal upon each zero voltage occurrence; and a master controller, responsive to each of the phase controllers of the first and second power sources and the generation of a trip signal by at least one of the phases of the first power source, causing each of the first power source phases of the first power source which have not generated a trip signal to be disconnected upon the detection of a zero current flow between each of the first power source phases which have not generated the trip signal and the electrical load by changing the conductivity of the associated first power source switching circuit to the second conductivity and causing each of the second power source phases to be connected to the electrical load upon the detection of a zero voltage in each of the second power source phases by changing the conductivity of the associated second power source switching circuit to the first conductivity. Upon the detection of a fault in at least one of the phases of the first power source, the phases of the first power source which have not been tripped may be coupled in parallel with corresponding phases of the second source until a next occurrence of zero current flow in the first power source phases which have not been tripped. Preferably, the first and second power sources have three phases but the invention is not limited thereto.

At least each of the controllers of the second power source has a zero voltage detector for detecting when the phase associated with the controller has a zero voltage and produces a zero voltage pulse in response to each zero voltage detection, and a gate, coupled to the zero voltage detector, for applying a signal causing the conduction of the second power source phase associated with the phase controller synchronous with the generation of a next zero voltage pulse. The gate may be an AND gate having a first input coupled to the zero voltage detector and a second input, coupled to the master controller, which has a first level signal in response to the generation of a trip signal in any one of the phases of the first power source, for producing an output signal enabling the conduction of the switching circuit of the phase of the second power source in response to a zero voltage pulse and the first level signal.

A power supply of an electrical load requiring minimal interruption of an power in accordance with a second embodiment of the invention includes a first power source having at least two phases, each power source phase having an associated first power source phase switching circuit disposed between the first power source phase and the electrical load, each first power source phase switching circuit having a first conductivity permitting current to flow between the associated first power source switching circuit and the electrical load and a second conductivity blocking current flow between the associated first power source switching circuit and the electrical load in response to a phase trip signal and a first power source phase controller controlling the conductivity of the associated first power source phase and generating the phase trip signal in response to detection of a voltage fault in the first power source phase; a second power source having an identical number of phases as the first power source, each second power source phase having an associated second power source switching circuit disposed between the second power source phase and the electrical load, each second power source switching circuit having a first conductivity permitting current to flow between the second power source and the electrical load and a second conductivity blocking current flow between the associated second power source phase switching circuit and the electrical load, each second power source phase not being connected to the electrical load during operation of the first power source when a trip condition producing the trip signal is not present, a second power source controller for controlling the conductivity of the associated second power source phase and monitoring the voltage of the associated phase of the second power source and producing a zero voltage signal upon each zero voltage occurrence; and a master controller, responsive to each of the phase controllers of the first and second sources and the generation of a trip signal by at least one of the phases of the first power source for causing each of the first power source phases of the first power source to be disconnected immediately in response to the detection of a trip signal by causing the switching circuits of all of the phases to be switched to the second conductivity and for connecting each of the second power source phases to the electrical load upon detection of a zero voltage in each of the second power source phases by changing the conductivity of the associated second power source switching circuits from the second conductivity to the first conductivity.

A power supply of an electrical load further in accordance with the invention includes a first power source having at least two phases, each first power source phase having an associated first power source phase switching circuit disposed between the first power source phase and the electrical load, each first power source phase switching circuit having a first conductivity permitting current flow between the associated first power source phase and the electrical load in response to either the absence of a fault condition in the first power source phase or in response to a second power source trip signal and a second conductivity blocking current flow between the first power source phase and the electrical load in response to a first power source phase trip signal, a first power source phase controller controlling the conductivity of the associated first power source switching circuit, detecting the presence of a fault condition, and generating the first power source trip signal in response to detection of a fault condition in the first power source phase; a second power source having an identical number of phases as the first power source, each second power source phase having an associated second power source switching circuit disposed between the second power source phase and the electrical load, each second power source switching circuit having a first conductivity permitting current to flow between the second power source phase and the electrical load and a second conductivity blocking current flow between the second power source phase and the electrical load, each second power source phase not being connected to the electrical load during operation of the first power source when the first power source phase trip signal has not been generated by at least one of the phases of the first power source, and a second power source phase controller controlling the conductivity of the associated power source phase switching circuit and detecting a fault condition in an associated phase of the second power source and generating a fault signal in response to the detection of the fault condition; a master controller, responsive to each of the phase controllers of the first and second power sources and the generation of a first power source trip signal by at least one of the phases of the first power source and the absence of a second power source trip signal, causing the phases of the first power source to be disconnected from the electrical load by changing the conductivity of the associated first power source switching circuits to the second conductivity, the phases of the second power source being connected to the electrical load by changing the conductivity of the associated second power source switching circuit to the first conductivity and generating the second power source trip signal in response to a fault signal generated by at least one of the phase controllers of the second power source.

In accordance with the first embodiment of the invention for each first power source phase, the associated first power source phase controller monitors the flow of current between the first power source phase and the electrical load for detecting when current flow between the first power source and the electric load is zero. For each second power source phase, the associated second power source phase controller monitors the voltage of the associated phase of the second power source and produces a zero voltage signal upon each zero voltage occurrence. The master controller, in response to the of the first power source trip signal by at least one of the phases of the first power source, causes each of the first power source phases of the first power source which have not generated a trip signal to be disconnected upon the detection of zero current flow between each of the first power source phases and the electrical load by changing the conductivity of the associated first power source switching circuit to the second conductivity and causes each of the second power source phases to be connected to the electrical load upon detection of a zero voltage in each of the second power source phases by changing the conductivity of the associated second power source switching circuit to the second conductivity.

In accordance with the second embodiment of the invention, for each second power source phase, the associated second power source phase controller monitors the voltage of the associated phase of the second power source and produces a zero voltage signal upon each zero voltage occurrence. Furthermore, in accordance with the second embodiment of the invention, the master controller, in response to the generation of the first power source trip signal by at least one of the phases of the first power source, causes each of the first power source phases of the first power source to be disconnected immediately by causing the first power source switching circuits of each of the phases to be switched to the second conductivity and causes connection of each of the second power source phases to the electrical load upon generation of a zero voltage signal by each of the associated controllers of the second power source phases by changing the conductivity of each of the associated second power source switching circuits to the second conductivity.

BRIEF DESCRIPTION OF DRAWINGS

FIG. 4 is a flowchart illustrating the operation of the second embodiment of the present invention in disconnecting the first power source form the electrical load and connecting the second power source to the electrical load upon the detection of a fault condition in the first power source.

BEST MODE FOR CARRYING OUT THE INVENTION

Figure 1:
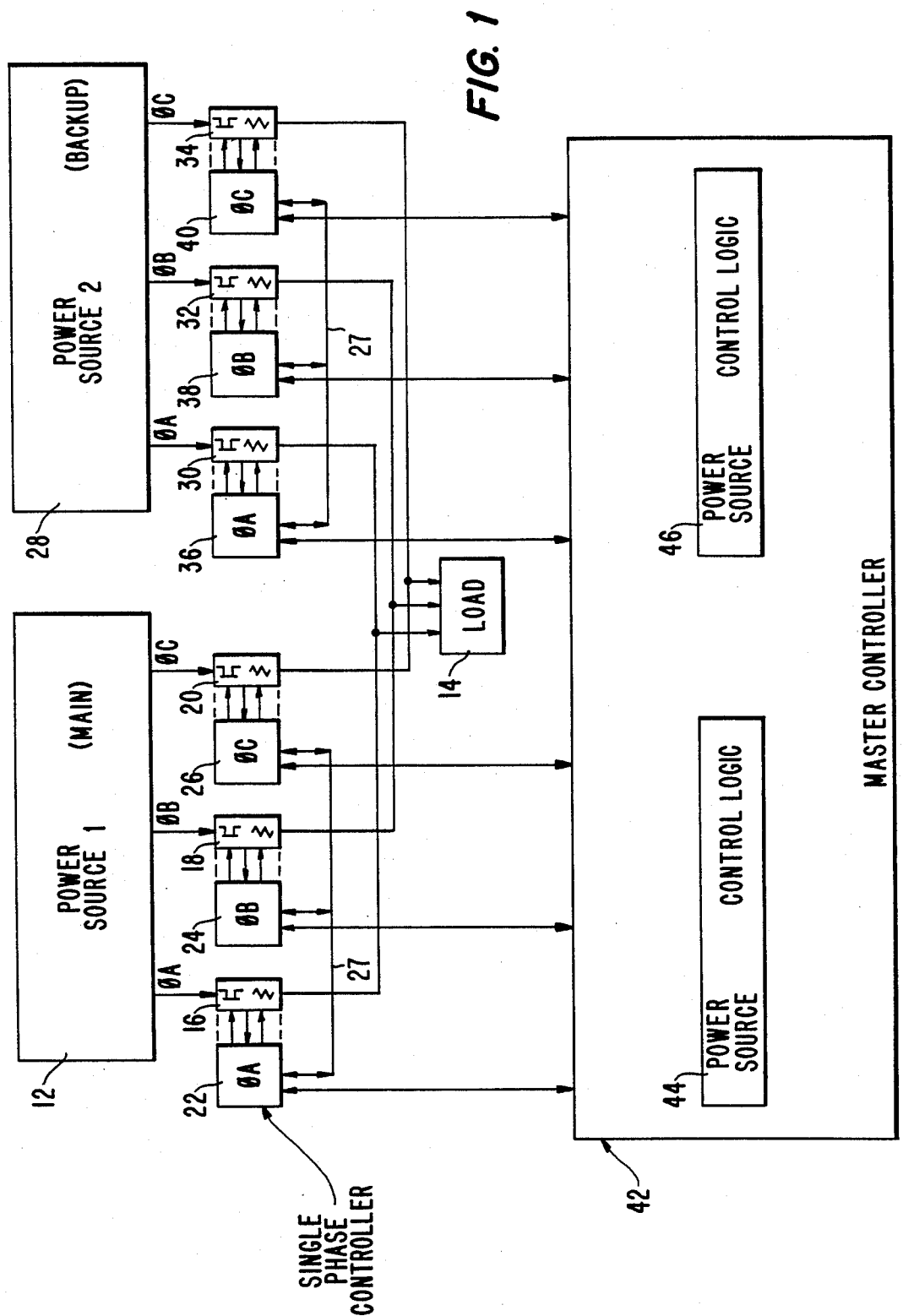
FIG. 1 is a block diagram of a power supply system in accordance with the present invention.
Figure 2:
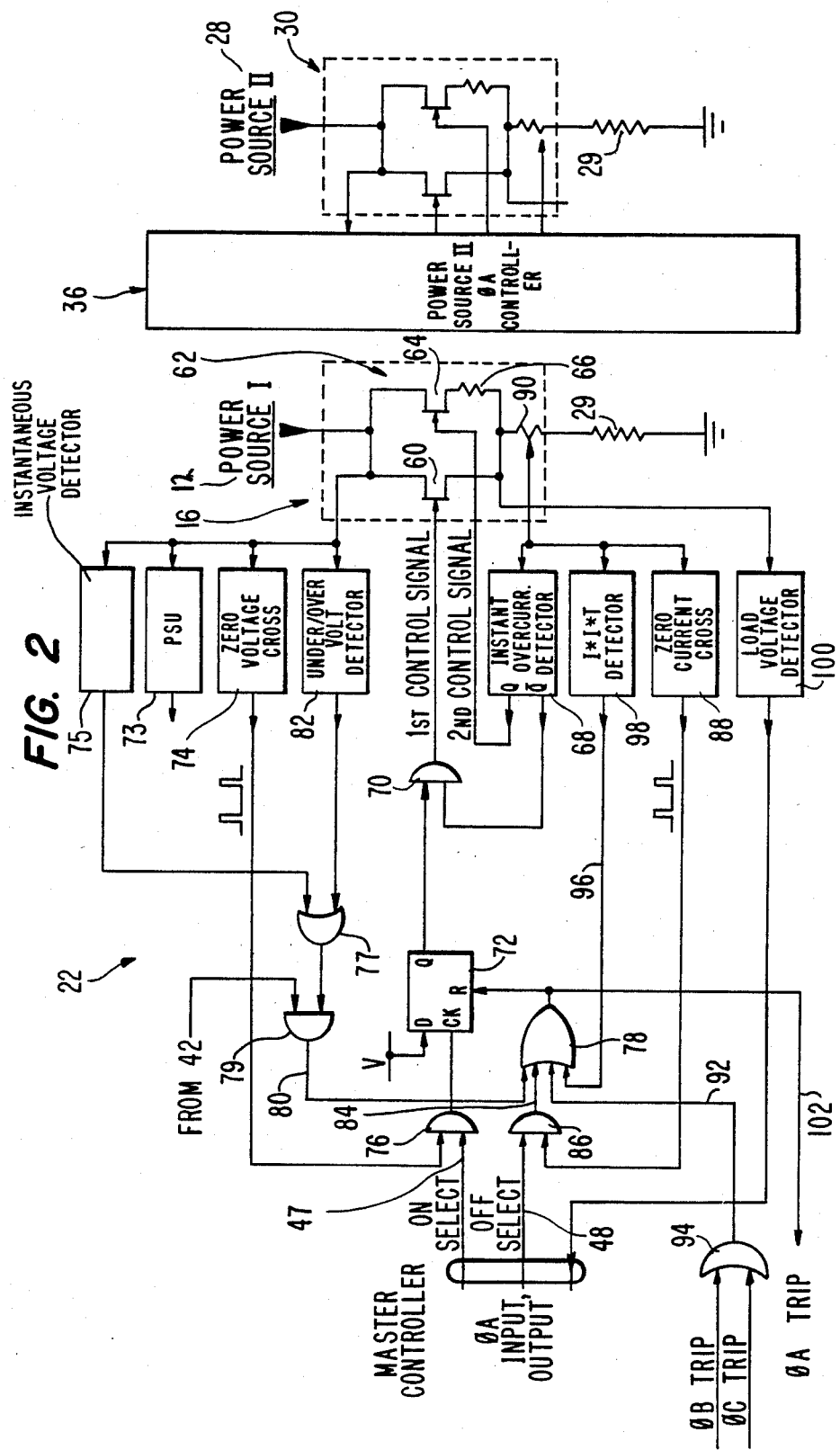
FIG. 2 is a block diagram of a single phase controller in accordance with a first embodiment of the present invention.

FIG. 1 illustrates a block diagram of a system for practicing two embodiments of the present invention. With the invention, a first three phase power source 12 is connected to a three phase electrical load 14 which is a load requiring minimal interruption of power such as that which is found in airframes but is not limited thereto. First, second and third switching circuits 16, 18 and 20 are respectively connected between phase A, B, and C outputs of the power source 12 and the corresponding phase A, B and C loads (not illustrated) of the electrical load 14. Each of the switching circuits 16, 18 and 20 have a first conductivity permitting current to flow between the associated phase output of the power source 12 and the associated phase load of the electrical load 14 and a second conductivity blocking current flow between the first power source and the electrical load. The conductivity of the first switching circuit 16 is controlled by a phase A controller 22. The conductivity of the second switching circuit 18 is controlled by a phase B controller 24. The conductivity of the third switching circuit is controlled by a phase C controller 26. Each of the switching circuits 16, 18 and 20 are identical and each of the phase A, phase B and phase C controllers 22, 24 and 26 are identical. A preferred embodiment of a single phase controller and associated switching circuit is illustrated in FIG. 2 described below. The first embodiment of the invention interconnects the respective switching circuits 16, 18 and 20 with their associated phase A, B and C controllers 22, 24 and 26 with the master controller 42. The second embodiment of the invention interconnects the respective phase controllers 22, 24 and 26 with line 27. In the first embodiment, the line 27 is not present. A second backup power source 28 is provided which has an identical construction to the first power source 12. The phase A, B and C outputs of the power source 28 are respectively controlled by switching circuits 30, 32 and 34 which are identical to switching circuits 16, 18 and 20. The switching circuit 30 has an associated phase A controller 36 which is identical to the phase A controller 22; the switching circuit 32 has an associated phase B controller 38 which is identical to phase B controller 24; and the third switching circuit 34 has an associated phase C controller 40 which is identical to the phase C controller 26. The first embodiment of the invention interconnects the respective switches 30, 32 and 34 with their associated phase A, B and C controllers 36, 38 and 40 with the master controller 42. The second embodiment of the invention interconnects the respective phase controllers 36, 38 and 40 with line 27. In the first embodiment the line 27 is not present. Each of the phase controllers 22, 24, 26, 36, 38 and 40 of the first power source 12 and the second power source 28 generate a trip signal in response to a voltage fault condition in the associated phase of the first power source 12 or the second power source 28. The trip signal causes the one or more phases in the first power source 12 having the voltage fault to be immediately disconnected by causing the associated switching circuit to switch to the second conductivity blocking current flow to the associated phase load of the electrical load 14. Additionally, the phase controllers 22, 24 and 26 monitor the flow of current between the phases of the first power source 12 and the corresponding phase load of the electrical load 14 for detecting each occurrence when current flow between a phase of the power source 12 and the corresponding phase load of electrical load 14 is zero. However, in the preferred embodiment of the present invention, the phase controllers 36, 38 and 40 each have the capability of monitoring current flow between the phase output of the power source 28 and the corresponding phase load of the electrical load 14 to permit either of the power sources 12 and 28 to be a main or a backup power source. Each of the phase controllers 22, 24 and 26, and 36, 38 and 40, respectively, monitor the voltage of the associated phase to produce a zero voltage signal upon each zero voltage occurrence. Master controller 42 is connected to each of the phase controllers 22, 24, 26, 36, 38 and 40 for controlling the operation of the switching circuits 16, 18, 20, 36, 38 and 40 in a timed sequence as described below in each of the first and second embodiments. The master controller 42 has a first power source control logic 44 for controlling the operation of the first power source 12 and a second power source control logic 46 for controlling the operation of the second power source 28. Preferably, the master controller is identical to that illustrated in FIGS. 4A-B of U.S. patent application Ser. No. 137,575, filed on even date herewith.

In the first embodiment, the master controller 42 is responsive to each of the phase controllers of the first and second power sources 12 and 28. In the absence of a trip signal being generated by one or more of the controllers 36, 38, and 40 of the second power 28, and in response to the generation of a trip signal by one or more of the phases of the first power source 12, the master controller 42 causes each of the first power source phases which have not generated a trip signal to be disconnected upon the detection of a zero current flow between each of the first power source phases and the electrical load by causing the switching circuits 16, 18 and 20 which have not been changed to the second conductivity to change to the second conductivity and causes each of the second power sources to be connected to the electrical load 14 upon detection of a zero voltage in each of the second power source phases by causing the switching circuits 30, 32 and 34 to change to the first conductivity. In the first embodiment, when a fault condition is present in one or more phases of the second power source 28, the master controller 42 disables the tripping of the first power source 12 as described below with reference to FIG. 2 below.

In the second embodiment of the invention, the master controller 42 is responsive to each of the phase controllers of the first and second power sources. In the absence of a trip signal being generated by one or more of the phase controllers 36, 38 and 40, the master controller 42, in response to the generation of a trip signal by one or more of the phases of the first power source causes all of the first power source phases of the first power source to be disconnected immediately by causing the switching of the switching circuits 16, 18 and 20 to the second conductivity and causes each of the second power sources to be connected to the electrical load 14 upon detection of a zero voltage by causing the switching circuits 30, 32 and 34 to switch to the first conductivity. In the second embodiment, when a fault condition is present in one or more phases of the second power source 28, the master controller disables the tripping of the phases of the first power source 12 as described below with reference to FIG. 2.

FIG. 2 illustrates the preferred construction of the individual phase controller 22, associated switching circuits 16, and their relationship with master controller 42. It should be understood that the remaining phase controllers 24, 26, 36, 38 and 40 are identical to the phase controller 22 and that the remaining switching circuits 18, 20, 30, 32 and 34 are identical to switching circuit 16. The switching circuit 16 is comprised of a first switch 60 connected between the first power source 12 and the phase A load 29 of the electrical load 14 to control the conduction of current therebetween. The first switch 60 is controlled by a first control signal having first and second levels and passing current to the load 29 when the first control signal is at the first level and blocking current flow when the first control signal is at the second level. A shunt circuit 62 is coupled in parallel with the switch 60 to provide a shunt current path by passing the switch 60 when preliminary samples of the magnitude of the current flowing from phase A of the power source to load 29 indicate that a current fault may exist in the load. The shunt circuit 62 is comprised of a switch 64 and a current limiting impedance 66. The magnitude of the impedance 66 is chosen to prevent damage to phase A of the first voltage source 12 during determination of whether or not the overcurrent condition is of a transient nature not requiring total disconnection of the power sources from the load 29 by taking a plurality of samples. In the preferred form of the invention, a predetermined count of samples, each exceeding the maximum rated current, must be accumulated, with samples below the maximum rated current decrementing the accumulated count of a counter, before the second control signal Q charges from a second low signal level to a first high signal level indicating a current (load) fault. The second control signal Q is produced by an instantaneous overcurrent detector 68 which is preferably that disclosed in U.S. patent application Ser. No. 137,583, filed on even date herewith.

The generation of the first control signal is responsive to a plurality of power supply operating conditions as described below. The inverted output $\overline{Q}$ from the instantaneous overcurrent detector is applied to AND gate 70 for the purpose of ensuring that under normal power supply operation when the instantaneous current is not exceeding the maximum level and no voltage fault exists, the first switch 60 is conductive and the second switch 64 is non-conductive. Thus, with the output Q from the instantaneous overcurrent detector 68 being normally low, the inverted output $\overline{Q}$ is normally high which causes the first control signal to assume the level of the Q output of D-type flip-flop 72. The D-type flip-flop 72 has a normally high level data input which is connected to power supply potential. The data level signal is outputted at Q when the clock input goes high. A power supply unit 73 is provided for providing power from the first power source 12. A zero voltage crossing detector 74 produces an output train of pulses which are synchronized with the zero crossing points of phase A of the power source 12. An ON SELECT signal 47 from the phase A portion of the master controller 42 is applied to AND gate 76 which enables the pulses outputted from the zero voltage crossing detector 74 to clock the flip-flop 72. The logic circuit for generating the ON SELECT signal is disclosed in FIGS. 2 and 4A-d of U.S. patent application Ser. No. 137,575, filed on even date herewith. Thus, under normal operation of phase A of the first power source 12, the output Q of flip-flop 72 is high enabling AND gate 70 which causes the first control signal to assume a high level rendering switch 60 conductive.

Turning off of the switch 60 is controlled by the reset input of the flip-flop 72. Furthermore, when the reset input of the flip-flop 72 goes high, the phase A trip signal is generated which is inputted to the first power source control logic 44 of the master controller 42 as described above. The reset input of flip-flop 72 goes high when the output of OR gate 78 goes high. OR gate 78 is responsive to four different inputs with any input high level causing the reset of the flip-flop 72 to go high which makes the first control signal go low turning off switch 60.

The first input 80 is from AND gate 79. AND gate 79 has a first input from the master controller 42 which is a second power source trip signal. The second power source trip signal, which is normally high when the phases of the second source are not tripped is generated by the master controller 42 ORING all of the trip signals 102 from the phases A, B and C of the second power source 28. When any of the phases of the second power source are tripped, the second power source trip signal goes low which prevents the first power source 12 from being tripped in response to a high level output from instantaneous voltage detector 75 or under/over voltage detector 82 as described below. The second input from AND gate 79 is from OR gate 77. OR gate 77 has a first input from instantaneous voltage detector 75 which produces a high output signal when a voltage fault is detected in the associated phase which causes switch 60 to turn off when the input to AND gate 79 from controller 42 is high signifying that the second power source is not tripped. The instantaneous voltage detector 73 may be the voltage fault detector disclosed in U.S. application Ser. No. 137,735, filed on even date herewith. The second input to the OR gate 77 is from the under/over voltage detector 82. The under/over voltage detector 82 compares the RMS value of the voltage from phase A with predetermined maximum and minimum RMS voltage limits and produces a high level output when the RMS voltage exceeds either the predetermined maximum or minimum voltage and a low level when the RMS voltage does not exceed either the predetermined maximum or minimum RMS voltage which causes switch 60 to turn off when the input to AND gate 79 from controller 42 is high signifying that the second power source is not tripped. A block diagram of a suitable RMS under/over voltage trip circuit is disclosed in FIG. 5 of U.S. patent application Ser. No. 137,575, filed on even date herewith An OFF SELECT signal input 48 is gated by AND gate 86. The logic circuit for generating the OFF SELECT signal is illustrated in FIGS. 2 and 4A-B of U.S. patent application Ser. No. 137,575, filed on even date herewith. The second input 84 to the OR gate 78 is important in that it controls the time at which the switch 60 is open circuited with respect to the AC voltage produced by phase A of the first voltage source 12 in response to a fault in phases B or C and causes switching to occur upon zero current flow between power source 12 and load 29. Switching of switch 60 at the zero current point reduces voltage surges which could damage or destroy the switch. The zero current crossing detector 88 monitors the AC signal produced by phase A of the first power source 12 to detect the points at which zero current occur. Zero current points may be detected by monitoring the voltage across resistor 90 and detecting the zero voltage points in view of the power factor in a resistor being 1. The zero current crossing circuit 88 produces output pulses synchronized with the zero voltage points across resistor 90. The zero current crossing detector 88 may, be a comparator, circuit such as that illustrated in FIG. 5 of U.S. patent application Ser. No. 137,583, filed on even date herewith. The OFF SELECT signal from the master controller 42 enables AND gate 86 to pass a high level pulse each time the zero current crossing detector 88 detects a zero current flow.

The third input 92 to OR gate 78 is a signal produced by OR gate 94 derived from the trip signals from phases B and C of the first power source 12. The output phase trip signal from each of the phases B and C, which correspond to the signal 102 produced by phase A, is applied to OR gate 94 to produce a high level output when either of the phases B and C has been tripped.

Finally, the fourth input 96 to the OR gate 78 is applied from the I$^2$t detector 96. The I$^2$t detector 96 produces a high level output signal each time an I$^2$t fault is detected. A preferred embodiment of the I$^2$t detector is disclosed in U.S. patent application Ser. No. 78,366, filed on July 27, 1987.

A load voltage fault detector 100 produces an output signal of a high level each time a fault is detected in switch 60 by detecting where the potential drops to zero which is indicative of an open circuit malfunction It should be understood that the OFF SELECT signal goes high in response to any one of the voltage detectors going high located in the respective phases A, B and C of the first power source 12. Thus, a high level OFF SELECT signal causes the reset to go high, upon the detection of zero current which drives D-type flip-flop 72 to produce the low state of the first control signal which turns off switch 60 thereby tripping phase A.

Furthermore, it should be understood that a high level output from OR gate 78 generates the phase A trip signal 102. The phase A trip signal is supplied to the master controller 42 as described above.

It should be understood that FIG. 2 does not illustrate the connection between the outputs of the instantaneous overcurrent detector 68, instantaneous voltage detector 75, the under/over voltage 82, and the I$^2$t detector 98 and the master controller 42 in order to avoid complicating the illustration. Furthermore, it should be understood that the master controller 42 has indicators for displaying the status of each of the detectors 68, 75, 82 and 98 as well as manual on/off and reset controls.

Figure 3:
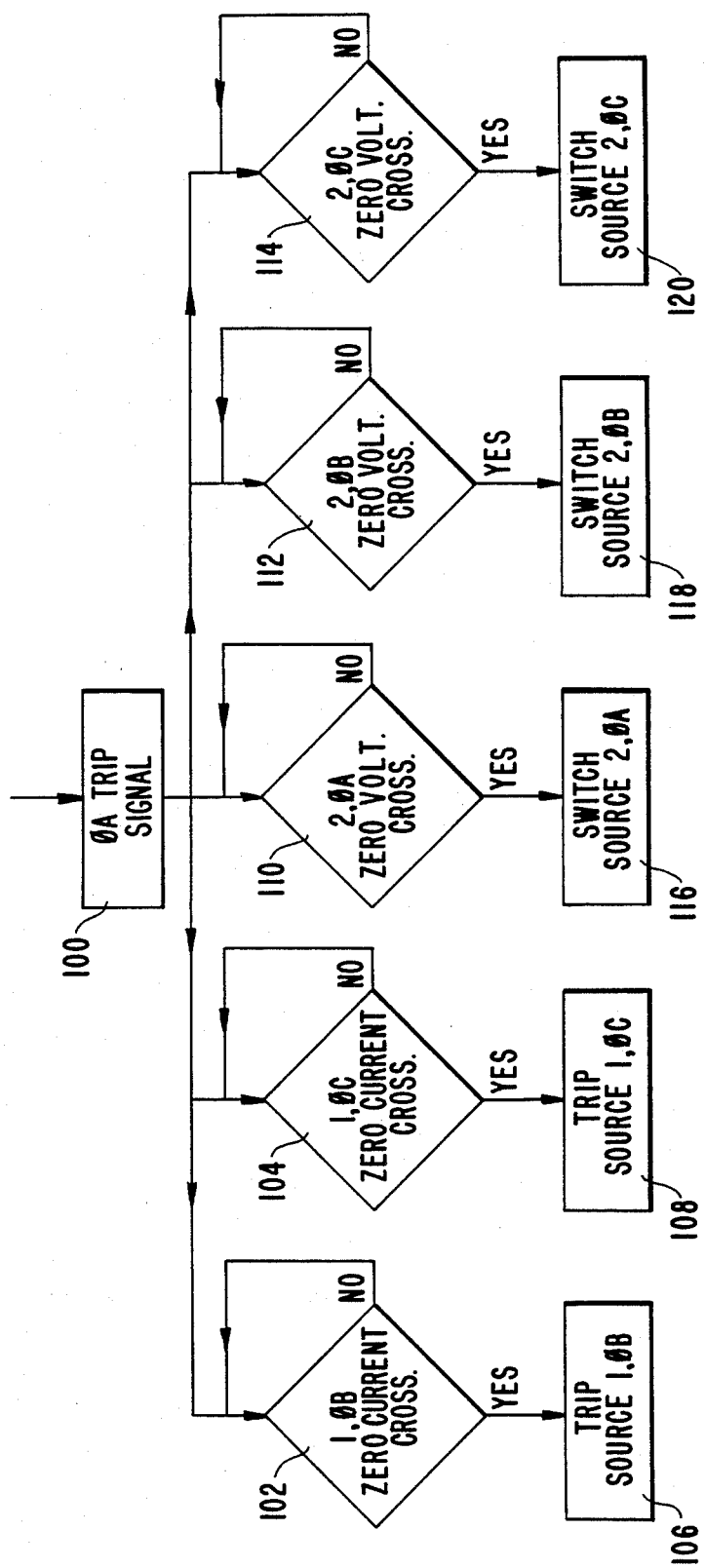
FIG. 3 is a flowchart illustrating the operation of the first embodiment of the present invention in disconnecting a first power source from an electrical load and connecting a second power source to the electrical load upon the detection of a fault condition in the first power source.

FIG. 3 is a flowchart illustrating the operation of the first embodiment of the present invention. Point 100 illustrates the generation of a trip signal by phase A which immediately causes the disconnection of power source 12 from load 48 as described above with reference to FIG. 2. The zero crossing points of phases B and C of the first power source 12 are signalled at decision points 102 and 104 respectively. As soon as the zero current crossing points are detected, the phases B and C of the first power source 12 are disconnected as indicated respectively at points 106 and 108. As indicated respectively at decision points 110, 112 and 114, the zero voltage points of the phases A, B and C of the second power source 28 are detected and the phases A, B and C are respectively connected to the A, B and C phases of the electrical load 14 as indicated by points 116, 118 and 120. It should further be understood that operation is identical for the immediate tripping of phases B or C at point 100 with the remaining phases which have not been tripped being tripped in accordance with points 102, 104, 106 and 108.

FIG. 4 illustrates a flowchart of the operation of the second embodiment of the present invention. Upon the detection of a condition in any of the phases A, B and C causing the generation of a trip signal by any one of the OR gates 78 of the phase controllers 22, 24 or 26, as indicated at point 122, each of the phases A, B and C of the first power source are immediately tripped as indicated at points 124, 126 and 128. The connection of the phases A, B and C of the second power source 28 to the respective phases of the electrical load 14 is identical to that illustrated above in FIG. 3. Identical parts of FIGS. 3 and 4 are identified by like reference numerals.

While the invention has been described in terms of its preferred embodiments, it should be understood that numerous modifications may be made thereto without departing from the spirit and scope of the invention as defined in the appended claims.

We claim:

1. A power supply of an electrical load requiring minimal interruption of power comprising:
   (a) a first power source having at least two phases, each first power source phase having
      (i) an associated first power source phase switching means disposed between the first power source phase and the electrical load, each first power source phase switching means having a first conductivity permitting current flow between the associated first power source phase and the electrical load and a second conductivity blocking current flow between the first power source phase and the electrical load in response to a phase trip signal, and
      (ii) a first power source phase controller controlling the conductivity of the associated first power source switching means, monitoring the flow of current between the first power source phase and the electrical load for detecting each occurrence when current flow between the first power source phase and the electrical load is zero, and generating the phase trip signal in response to detection of a voltage fault in the first power source phase;
   (b) a second power source having an identical number of phases as the first power source, each second power source phase each having
      (i) an associated second power source switching means disposed between the second power source phase and the electrical load, each second power source switching means having a first conductivity permitting current to flow between the second power source phase and the electrical load and a second conductivity blocking current flow between the second power source phase and the electrical load, each second power source phase not being connected to the electrical load during operation of the first power source when a fault condition producing the phase trip signal is not present in at least one phase of the first power source by maintaining the second power source switching means in the second conductivity, and
      (ii) a second power source controller controlling the conductivity of the associated second power source phase switching means and monitoring the voltage of the associated phase of the second power source and producing a zero voltage signal upon each zero voltage occurrence; and
   (c) a master controller, responsive to each of the phase controllers of the first and second power sources and the generation of the phase trip signal by at least one of the phases of the first power source, causing each of the first power source phases of the first power source which have not generated a trip signal to be disconnected upon the detection of zero current flow between each of the first power source phases and the electrical load by changing the conductivity of the associated first power source switching means to the second conductivity and causing each of the second power source phases to be connected to the electrical load upon generation of the zero voltage signal in each of the second power source phases by changing the conductivity of the associated second power source switching means to the first conductivity.

2. A power supply in accordance with claim 1 wherein:
   each of the first and second power sources has three phases.

3. A power supply in accordance with claim 1 wherein each of the controllers of the second power source includes:
   a zero voltage detector for detecting when the phase associated with the controller has a zero voltage and producing the zero voltage signal in response to each zero voltage detection; and
   a gating means, coupled to the zero voltage detector and to the master controller, for applying a signal causing the connection of the second power source phase associated with the second power source phase controller synchronously with the generation of a next zero voltage signal to the electrical load.

4. A power supply in accordance with claim 3 wherein the gating means of each of the controllers of the second power source comprises:
   a gate having a first input coupled to the associated zero voltage detector and a second input, coupled to the master controller, having a first level in response to the generation of a trip signal in any one of the phases of the first power source for producing an output signal causing the conduction of the switching means of the phase of the second power source to change to the first conductivity in response to the zero voltage signal and the first input being the first level signal.

5. A power supply of an electrical load requiring minimal interruption of power comprising:
   (a) a first power source having at least two phases, each first power source phase having
      (i) an associated first power source phase switching means disposed between the first power source phase and the electrical load, each first power source phase switching means having a first conductivity permitting current to flow between the associated first power source switching means and the electrical load and second conductivity blocking current flow between the first power source phase and the electrical load in response to a phase trip signal, and
      (ii) a first power source phase controller controlling the conductivity of the associated first power source phase, and generating the phase trip signal in response to detection of a voltage fault in the first power source phase;
   (b) a second power source having an identical number of phases as the first power source, each phase having
      (i) an associated second power source switching means disposed between the second power source phase and the electrical load, each second power source switching means having a first conductivity permitting current to flow between the second power source phase and the electrical load and a second conductivity blocking current flow between the second power source phase and the electrical load, each second power source phase not being connected to the electrical load during operation of the first power source when a fault condition producing the phase trip signal is not present in the first power source, and
      (ii) a second power source controller for controlling the conductivity of the associated second power source phase and monitoring the voltage of the associated phase of the second power source and producing a zero voltage signal upon each zero voltage occurrence; and
   (c) a master controller, responsive to each of the phase controllers of the first and second power sources and the generation of the phase trip signal by at least one of the phases of the first power source, causing each of the first power source phases of the first power source to be disconnected immediately in response to the detection of the phase trip signal by causing the switching means of the phases to be switched to the second conductivity and for connecting each of the second power source phases to the electrical load upon detection of zero voltage in each of the second power source phases by changing the conductivity of the associated second power source switching means from the second conductivity to the first conductivity.

6. A power supply in accordance with claim 5 wherein each of first and second power sources has three phases.

7. A power supply in accordance with claim 5 wherein each of the controllers of the second power source includes:
   a zero voltage detector for detecting when the phase associated with the controller has a zero voltage and producing the zero voltage signal in response to each zero voltage detection; and
   a gating means, coupled to the zero voltage detector and to the master controller, for applying a signal causing the connection of the second power source phase associated with the second power source phase controller synchronously with the generation of the next zero voltage signal to the electrical load.

8. A power supply in accordance with claim 7 wherein the gating means of each of the controllers of the second power source comprises:
   a gate having a first input coupled to the associated zero voltage detector and a second input, coupled to the master controller, having a first level in response to the generation of a phase trip signal in any one of the phases of the first power source for producing an output signal causing the conduction of the switching means of the phase of the second power source to change to the first conductivity in response to the zero voltage signal and the first input being the first level signal.

9. A power supply of an electrical load comprising:
   (a) a first power source having at least two phases, each power source phase having
      (i) an associated first power source phase switching means disposed between the first power source phase and the electrical load, each first power source phase switching means having a first conductivity permitting current flow between the associated first power source phase and the electrical load in response to either the absence of a fault condition in the first power source phase or in response to a second power source trip signal and a second conductivity blocking current flow between the first power source phase and the electrical load in response to a first power source phase trip signal, and
      (ii) a first power source phase controller controlling the conductivity of the associated first power source switch, detecting the presence of a fault condition, and generating the first power source phase trip signal in response to detection of a fault condition in the first power source phase.
   (b) a second power source having an identical number of phases as the first power source, each second power source phase having
      (i) an associated second power source switching means disposed between the second power source phase and the electrical load, each second power source switching means having a first conductivity permitting current to flow between the second power source phase and the electrical load and a second conductivity blocking current flow between the second power source phase and the electrical load, each second power source phase not being connected to the electrical load during operation of the first power source when the first power source trip signal has not been generated by at least one of the phases of the first power source, and
      (ii) a second power source phase controller controlling the conductivity of the associated power source phase and detecting a fault condition in an associated phase of the second power source and generating a fault signal in response to the detection of the fault condition;
   (c) a master controller, responsive to each of the phase controllers of the first and second power sources and the generation of a first power source trip signal by at least one of the phases of the first power source and the absence of the second power source trip signal to cause the phases of the first power source to be disconnected from the electrical load by changing the conductivity of the associated first power source switching means to the second conductivity and to cause the phases of the second power source to be connected to the electrical load upon the detection of zero voltage in each of the second power source phases by changing the conductivity of the associated second power source switching means to the first conductivity and generating the second power trip signal in response to a fault signal generated by at least one of the phase controllers of the second power source.

10. A power supply for electrical loads in accordance with claim 9:
(a) wherein for each first power source phase the associated first power source phase controller monitors the flow of current between the first power source phase and the electrical load for detecting each occurrence when current flow between the first power source and the electrical load is zero;
(b) wherein for each second power source phase the associated second power source phase controller monitors the voltage of the associated phase of the second power source and produces a zero voltage signal upon each zero voltage occurrence; and
(c) the master controller, in response to the generation of the first power source trip signal by at least one of the phases of the first power source, causes each of the first power source phases of the first power source which have not generated a trip signal to be disconnected upon the detection of zero current flow between each of the first power source phases and the electrical load by changing the conductivity of the associated first power source switching means to the second conductivity and causing each of the second power source phases to be connected to the electrical load upon detection of zero voltage in each of the second power source phases by changing the conductivity of the associated second power source switching means to the second conductivity.

11. A power supply in accordance with claim 10 wherein:
each of the first and second power sources has three phases.

12. A power supply in accordance with claim 10 wherein each of the controllers of the second power source includes:
a zero voltage detector for detecting when the phase associated with the controller has a zero voltage and producing the zero voltage signal in response to each zero voltage detection; and
a gating means, coupled to the zero voltage detector and the master controller, for applying a signal causing the connection of the second power source phase associated with the second power source phase controller, synchronously with the generation of the next zero voltage signal, to the electrical load.

13. A power supply in accordance with claim 12 wherein the gating means of each of the controllers of the second power source comprises:
a gate having a first input coupled to the associated zero voltage detector and a second input, coupled to the master controller, having a first level in response to the generation of the first power source phase trip signal in any one of the phases of the first power source for producing an output signal causing the conduction of the second power source switching means of the phase of the second power source to change to the first conductivity in response to the zero voltage signal and the first input being the first level signal.

14. A power supply for electrical loads in accordance with claim 9:
(a) wherein for each second power source phase the associated second power source phase controller monitors the voltage of the associated phase of the second power source and produces a zero voltage signal upon each zero voltage occurrence; and
(b) the master controller, in response to the generation of a first power source trip signal by at least one of the phases of the first power source, causes each of the first power source phases of the first power source to be disconnected immediately by causing the first power source switching means of each of the phases to be switched to the second conductivity and causes connection of each of the second power source phases to the electrical load upon generation of the zero voltage signal by each of the associated controllers of the second power source phases by changing the conductivity of the second power source switching means to the first conductivity.

15. A power supply in accordance with claim 14 wherein:
each of first and second power sources has three phases.

16. A power supply in accordance with claim 14 wherein each of the controllers of the second power source includes:
(a) a zero voltage detector for detecting when the phase associated with the second power source controller has a zero voltage and produces the zero voltage signal in response to each zero voltage detection; and
(b) a gating means, coupled to the zero voltage detector and the master controller, for applying a signal causing the connection of the second power source phase associated with the phase controller synchronously with the generation of the next zero voltage signal to the electrical load.

17. A power supply in accordance with claim 16 wherein the gating means of each of the controllers of the second power source comprises:
a gate having a first input coupled to the associated zero voltage detector and a second input, coupled to the master controller, having a first level in response to the generation of the first power source phase trip signal in any one of the phases of the first power source for producing an output signal causing the conduction of the second power source switching means of the phase of the second power source to change to the first conductivity in response to the zero voltage signal and the first input being the first level signal.

* * * * *